(12) United States Patent
Sekiya et al.

(10) Patent No.: US 9,112,019 B2
(45) Date of Patent: Aug. 18, 2015

(54) WAFER PROCESSING UTILIZING A FRAME WITH A PLURALITY OF PARTITIONS

(71) Applicant: DISCO CORPORATION, Tokyo (JP)

(72) Inventors: Kazuma Sekiya, Tokyo (JP); Tomotaka Tabuchi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/549,823

(22) Filed: Nov. 21, 2014

(65) Prior Publication Data

US 2015/0147870 A1    May 28, 2015

(30) Foreign Application Priority Data

Nov. 25, 2013    (JP) ................. 2013-242960

(51) Int. Cl.

| | |
|---|---|
| *H01L 21/00* | (2006.01) |
| *H01L 23/34* | (2006.01) |
| *H01L 21/78* | (2006.01) |
| *H01L 21/3065* | (2006.01) |
| *H01L 21/683* | (2006.01) |
| *H01L 21/311* | (2006.01) |
| *H01L 23/544* | (2006.01) |
| *H01L 21/304* | (2006.01) |

(52) U.S. Cl.
CPC ............ *H01L 21/78* (2013.01); *H01L 21/3065* (2013.01); *H01L 21/31116* (2013.01); *H01L 21/6835* (2013.01); *H01L 23/544* (2013.01); *H01L 21/3043* (2013.01); *H01L 21/31138* (2013.01)

(58) Field of Classification Search
CPC .................... H01L 21/31116; H01L 21/3043; H01L 21/78; H01L 23/544; H01L 21/31138
See application file for complete search history.

(56) References Cited

U.S. PATENT DOCUMENTS

| | | | |
|---|---|---|---|
| 7,541,658 B2* | 6/2009 | Kinsman ........................ 257/433 |
| 2004/0038442 A1* | 2/2004 | Kinsman .......................... 438/64 |
| 2006/0035415 A1* | 2/2006 | Wood et al. .................... 438/125 |
| 2009/0298300 A1* | 12/2009 | Ranish et al. ................. 438/795 |
| 2012/0235282 A1* | 9/2012 | Tomono et al. ................ 257/618 |

FOREIGN PATENT DOCUMENTS

JP    2006-120834    5/2006

* cited by examiner

*Primary Examiner* — Alonzo Chambliss
(74) *Attorney, Agent, or Firm* — Greer Burns & Crain Ltd.

(57) ABSTRACT

A wafer processing method for dividing a wafer into individual devices along a plurality of crossing division lines includes preparing a frame having a plurality of crossing partitions corresponding to the division lines of the wafer, spreading a liquid resin on the front side or back side of the wafer and positioning the partitions of the frame in alignment with the division lines of the wafer, thereby covering with the liquid resin the regions on the front side or back side of the wafer other than the regions corresponding to the division lines, curing the liquid resin supplied to the front side or back side of the wafer and next removing the frame, thereby masking the regions other than the regions corresponding to the division lines, and plasma-etching the wafer processed by the masking to thereby divide the wafer into the individual devices along the division lines.

1 Claim, 7 Drawing Sheets

WAFER PROCESSING UTILIZING A FRAME WITH A PLURALITY OF PARTITIONS

BACKGROUND OF THE INVENTION

1. Field of the Invention

The present invention relates to a wafer processing method for dividing a wafer into individual devices along a plurality of crossing division lines formed on the front side of the wafer, the individual devices being respectively formed in a plurality of separate regions defined by the division lines.

2. Description of the Related Art

In a semiconductor device fabrication process, a plurality of crossing division lines are formed on the front side of a substantially disk-shaped semiconductor wafer to thereby define a plurality of separate regions where a plurality of devices such as ICs and LSIs are respectively formed. The semiconductor wafer is cut along the division lines to thereby divide the regions where the devices are formed from each other, thus obtaining the individual devices. Cutting of the semiconductor wafer along the division lines is usually performed by using a cutting apparatus called a dicing saw. This cutting apparatus includes a chuck table for holding a workpiece, cutting means having a cutting blade for cutting the workpiece held on the chuck table, and feeding means for relatively moving the chuck table and the cutting means. By feeding the chuck table holding the workpiece as rotating the cutting blade, the wafer is cut along each division line.

However, when the wafer is cut by the cutting blade of the cutting apparatus mentioned above, chipping is apt to occur in the periphery of each device chip divided from the wafer, causing a reduction in die strength of each device chip. To solve such a problem, there has been proposed a method including the steps of forming a resist film on the back side of a wafer, exposing to light the region of the resist film corresponding to each division line of the wafer, thereby removing this region by development, and then etching the wafer from the resist film side along the division lines by plasma etching or the like, thereby dividing the wafer along the division lines (see Japanese Patent Laid-open No. 2006-120834, for example).

The above method of dividing the wafer along the division lines by using plasma etching has the following merits. Unlike the cutting by the use of a cutting blade, no chipping occurs along a division groove formed by the plasma etching, so that the die strength of each device can be improved. Further, even when the diameter of the wafer becomes as large as 450 mm or 600 mm, all of the division lines can be etched at a time to divide the wafer into the individual devices, thereby improving the productivity.

SUMMARY OF THE INVENTION

However, the method of dividing the wafer along the division lines by using plasma etching requires an exposure apparatus and a developing apparatus for exposing to light the region of the resist film formed on the back side of the wafer corresponding to each division line of the wafer, thereby removing this region by development. Accordingly, there arises a problem such that an equipment cost is increased.

It is therefore an object of the present invention to provide a wafer processing method which can divide a wafer along division lines of the wafer by using plasma etching without the need for an exposure apparatus and a developing apparatus.

In accordance with an aspect of the present invention, there is provided a wafer processing method for dividing a wafer into individual devices along a plurality of crossing division lines formed on the front side of the wafer, the individual devices being respectively formed in a plurality of separate regions defined by the division lines. The wafer processing method includes: a frame preparing step of preparing a frame having a plurality of crossing partitions corresponding to the division lines of the wafer; a resin covering step of spreading a liquid resin on the front side or back side of the wafer and positioning the partitions of the frame in alignment with the division lines of the wafer, thereby covering with the liquid resin the regions on the front side or back side of the wafer other than the regions corresponding to the division lines; a masking step of curing the liquid resin supplied to the front side or back side of the wafer and next removing the frame, thereby masking the regions other than the regions corresponding to the division lines; and an etching step of plasma-etching the wafer processed by the masking step to thereby divide the wafer into the individual devices along the division lines. The frame to be prepared in the frame preparing step is treated with a release agent for preventing that the liquid resin cured in the masking step may stick to the frame.

According to the wafer processing method of the present invention, no exposure apparatus and no developing apparatus are required to thereby suppress an equipment cost. Furthermore, the partitions of the frame to be prepared in the frame preparing step are treated with a release agent such as a coating of fluororesin. Accordingly, in removing the frame from the wafer in the masking step, there is no possibility that the liquid resin cured in the masking step may stick to the partitions of the frame, so that it is possible to prevent the generation of burrs due to sticking of the liquid resin cured to the partitions.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1:
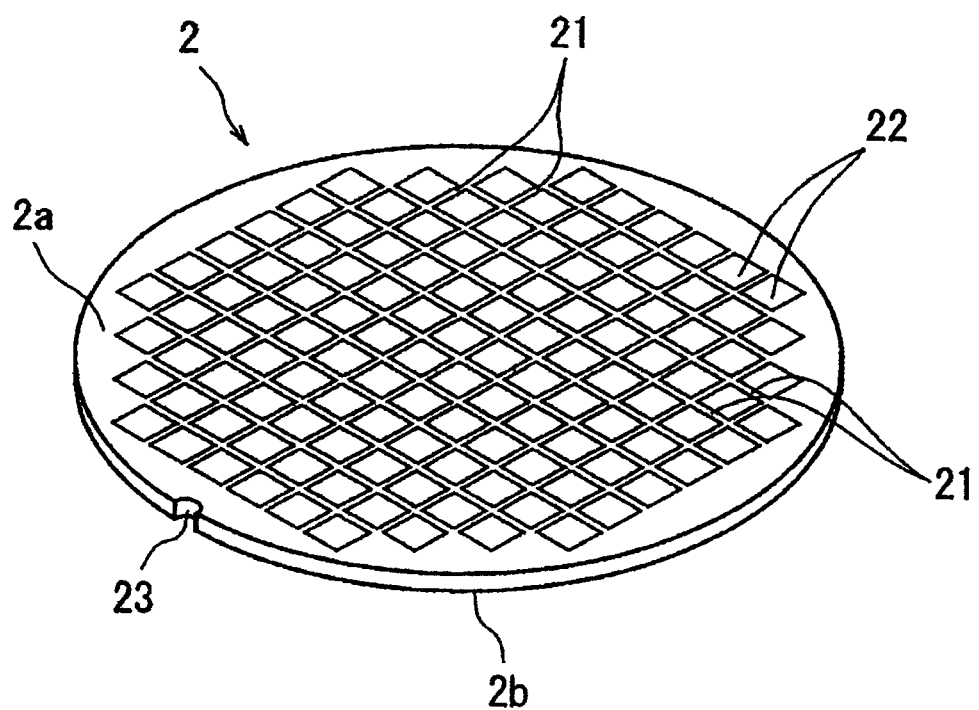
FIG. 1 is a perspective view of a semiconductor wafer to be divided by the wafer processing method according to the present invention.

A preferred embodiment of the wafer processing method according to the present invention will now be described in detail with reference to the drawings. FIG. 1 is a perspective view of a semiconductor wafer 2 as a workpiece to be processed in accordance with the present invention. The semiconductor wafer 2 shown in FIG. 1 is a silicon wafer having a thickness of 100 μm, for example. The semiconductor wafer 2 has a front side 2a and a back side 2b. A plurality of crossing division lines 21 are formed on the front side 2a of the semiconductor wafer 2 to thereby define a plurality of separate regions where a plurality of devices 22 such as ICs and LSIs are respectively formed. Further, a notch 23 for indicating a crystal orientation is formed on the outer circumference of the semiconductor wafer 2 so as to extend from the front side 2a to the back side 2b.

Figure 2A:
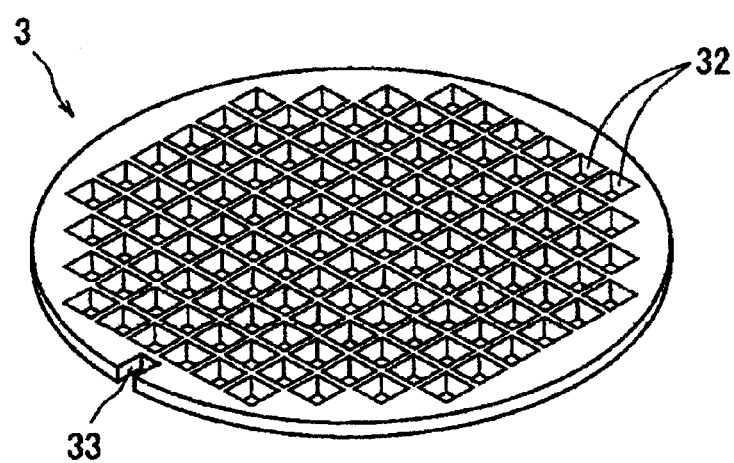
FIG. 2A is a perspective view of a frame having a plurality of crossing partitions corresponding to the division lines formed on the semiconductor wafer shown in FIG. 1.
Figure 2B:
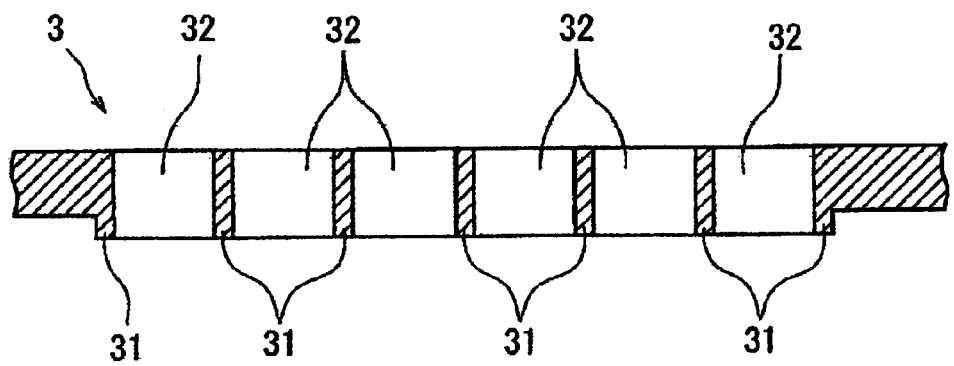
FIG. 2B is an enlarged sectional view of an essential part of the frame shown in FIG. 2A.

There will now be described a wafer processing method for dividing the semiconductor wafer 2 into the individual devices 22 along the division lines 21. First, a frame preparing step is performed to prepare a frame having a plurality of crossing partitions corresponding to the division lines 21 formed on the semiconductor wafer 2. This frame will now be described with reference to FIGS. 2A and 2B. In FIGS. 2A and 2B, reference symbol 3 denotes this frame, which includes a plurality of crossing partitions 31 corresponding to the division lines 21. Accordingly, a plurality of hollow regions 32 are defined by the plural partitions 31. The frame 3 is formed of metal or silicon. The outer circumference of the frame 3 is formed with a cutout 33 as an alignment mark corresponding to the notch 23 formed on the outer circumference of the semiconductor wafer 2. The partitions 31 of the frame 3 are preliminarily treated with a release agent such as a coating of fluororesin.

Figure 3A:
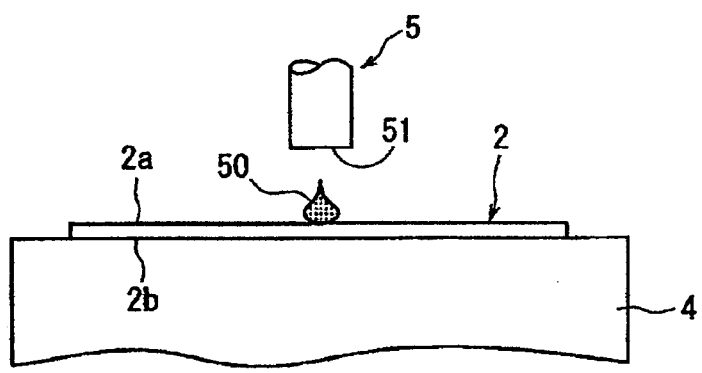
FIGS. 3A to 3C are views for illustrating a liquid resin spreading step in a resin covering step.
Figure 3B:
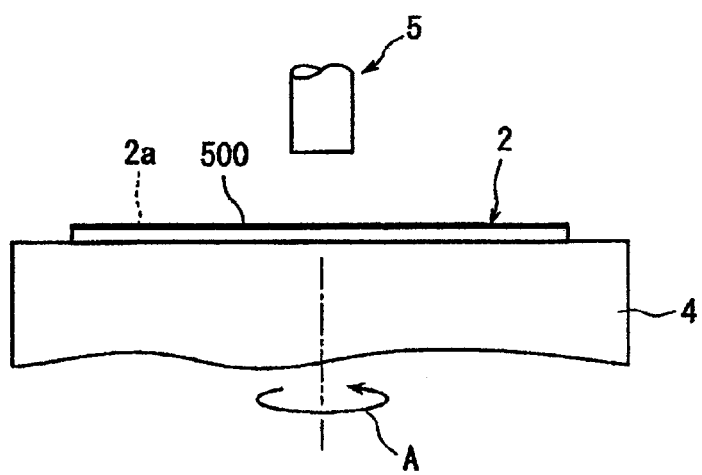

After performing the frame preparing step mentioned above, a resin covering step is performed in such a manner that a liquid resin is spread on the front side 2a or back side 2b of the semiconductor wafer 2 and the partitions 31 of the frame 3 are positioned in alignment with the division lines 21 of the semiconductor wafer 2, thereby covering with the liquid resin the regions on the front side 2a or back side 2b of the semiconductor wafer 2 other than the regions corresponding to the division lines 21. First, in performing this resin covering step, a liquid resin for masking is spread on the front side 2a or back side 2b of the semiconductor wafer 2 (liquid resin spreading step). In this preferred embodiment, the liquid resin is spread on the front side 2a of the semiconductor wafer 2 as shown in FIGS. 3A and 3B. Referring to FIG. 3A, the semiconductor wafer 2 is held on a holding table 4 in the condition where the back side 2b of the semiconductor wafer 2 is attached through a peelable adhesive to the upper surface of the holding table 4.

Figure 3C:
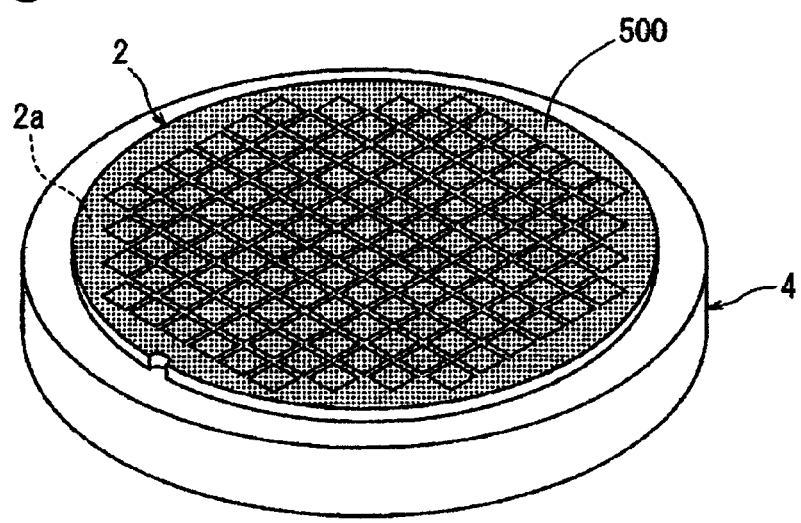

Accordingly, the semiconductor wafer 2 is held on the holding table 4 in the condition where the front side 2a of the semiconductor wafer 2 is oriented upward. After holding the semiconductor wafer 2 on the holding table 4 as mentioned above, a nozzle opening 51 included in a liquid resin nozzle 5 is positioned directly above the center of the semiconductor wafer 2 held on the holding table 4 as shown in FIG. 3A. Thereafter, liquid resin supplying means (not shown) is operated to drop a predetermined amount of liquid resin 50 from the nozzle opening 51 of the liquid resin nozzle 5 onto the central area of the front side 2a of the semiconductor wafer 2 held on the holding table 4. After dropping the predetermined amount of the liquid resin 50 onto the central area of the front side 2a of the semiconductor wafer 2 as mentioned above, the holding table 4 is rotated in the direction shown by an arrow A in FIG. 3B at 100 rpm, for example, for a predetermined period of time. As a result, the liquid resin 50 is spread over the entire surface of the front side 2a of the semiconductor wafer 2 held on the holding table 4 by a centrifugal force, so that a resin film 500 in the liquid state is formed on the front side 2a of the semiconductor wafer 2 as shown in FIGS. 3B and 3C. The thickness of the resin film 500 to be formed on the front side 2a of the semiconductor wafer 2 may be set to about 50 μm, depending upon the amount of the liquid resin 50 to be dropped. The liquid resin 50 may be provided by epoxy resin, resist resin, etc., which are not etched by a plasma etching gas.

Figure 4A:
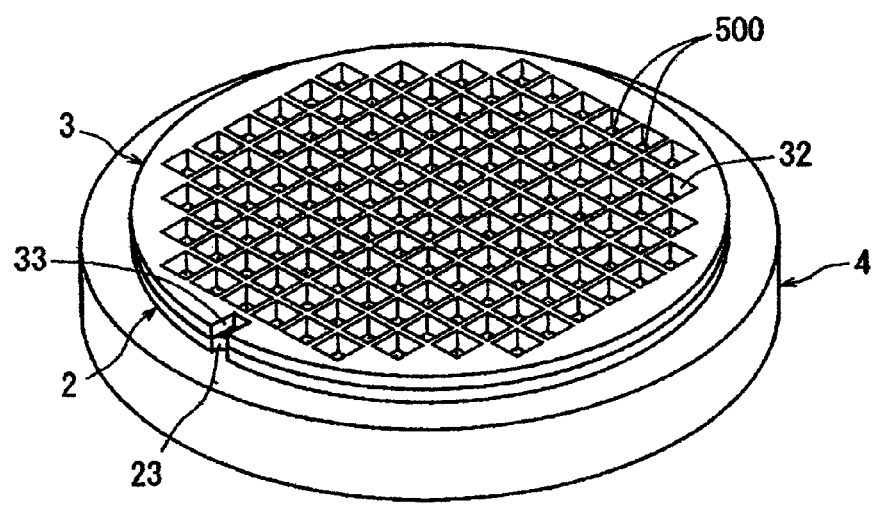
FIGS. 4A and 4B are views for illustrating a resin removing step in the resin covering step.
Figure 4B:
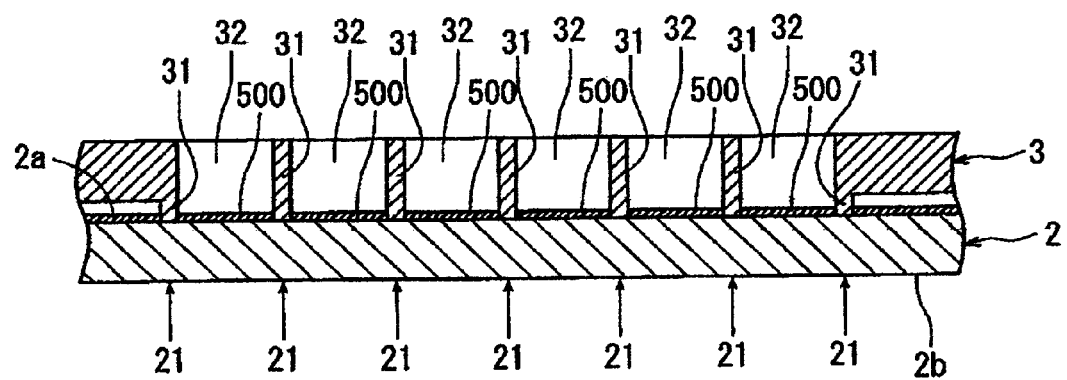

After performing the liquid resin spreading step mentioned above, the partitions 31 of the frame 3 are positioned in alignment with the division lines 21 of the semiconductor wafer 2 and then pressed against the resin film 500 in the liquid state present on the division lines 21 as shown in FIGS. 4A and 4B. At this time, the frame 3 is positioned so that the cutout 33 formed on the outer circumference of the frame 3 is aligned with the notch 23 formed on the outer circumference of the semiconductor wafer 2. As a result, the resin film 500 in the liquid state present in the regions corresponding to the division lines 21 is removed, so that the regions on the front side 2a of the semiconductor wafer 2 other than the regions corresponding to the division lines 21 are covered with the resin film 500 in the liquid state as shown in FIG. 4B (resin removing step).

Figure 5A:
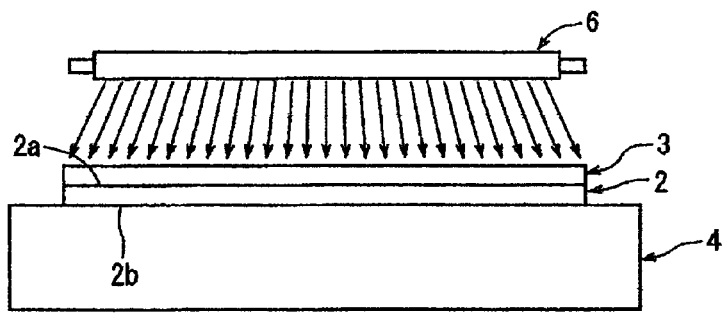
FIGS. 5A to 5D are views for illustrating a masking step.
Figure 5B:
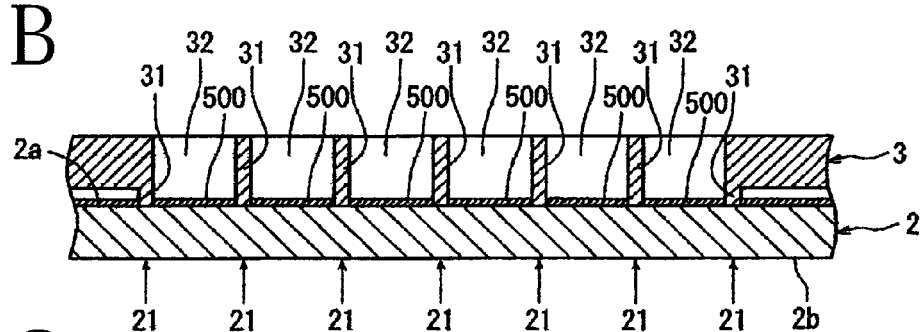

After performing the resin covering step mentioned above, a masking step is performed in such a manner that the liquid resin 50 supplied to the front side 2a or back side 2b of the semiconductor wafer 2 (the front side 2a in this preferred embodiment) is cured and the frame 3 is next removed, thereby masking the regions other than the regions corresponding to the division lines 21. This masking step will now be described with reference to FIGS. 5A to 5D. In performing the masking step, the liquid resin 50 supplied to the front side 2a or back side 2b of the semiconductor wafer 2 (the front side 2a in this preferred embodiment) is first cured (resin curing step). As shown in FIGS. 5A and 5B, this resin curing step is performed in such a manner that a heater 6 located above the semiconductor wafer 2 held on the holding table 4 is operated to heat the liquid resin 50 (the resin film 500 in the liquid state) in the condition where the frame 3 is kept on the semiconductor wafer 2.

Figure 5C:
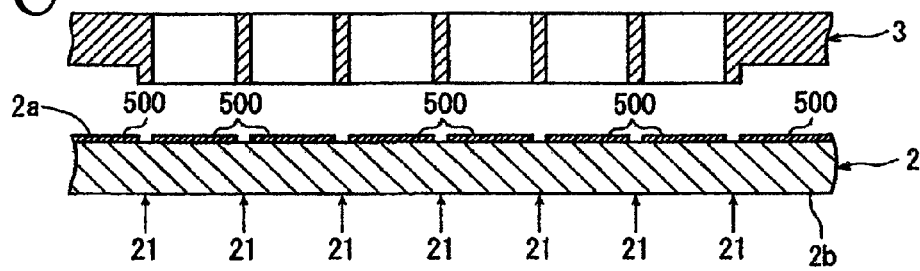
Figure 5D:
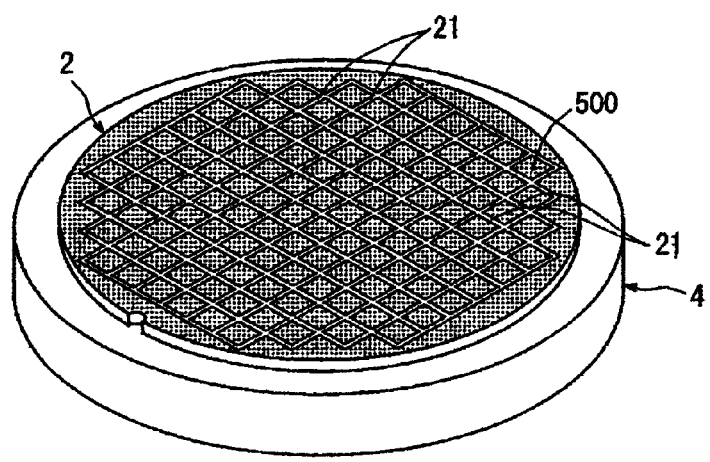

As a result, the resin film 500 in the liquid state is cured. After performing this resin curing step, the frame 3 is removed from the semiconductor wafer 2 to form the cured resin films 500 on the front side 2a of the semiconductor wafer 2 in the regions other than the regions corresponding to the division lines 21 as shown in FIG. 5C (frame removing step). As described above, the partitions 31 of the frame 3 are treated with a release agent such as a coating of fluororesin. Accordingly, there is no possibility that the cured resin films 500 may stick to the partitions 31 of the frame 3 in removing the frame 3, so that it is possible to prevent the generation of burrs due to sticking of the cured resin films 500 to the partitions 31. As a modification, ultrasonic vibration may be applied to the frame 3 in removing the frame 3 from the semiconductor wafer 2. By performing the masking step composed of the resin curing step and the frame removing step as mentioned above, the regions of the front side 2a of the semiconductor wafer 2 other than the regions corresponding to the division lines 21 are masked by the cured resin films 500 as shown in FIG. 5D.

Figure 6:
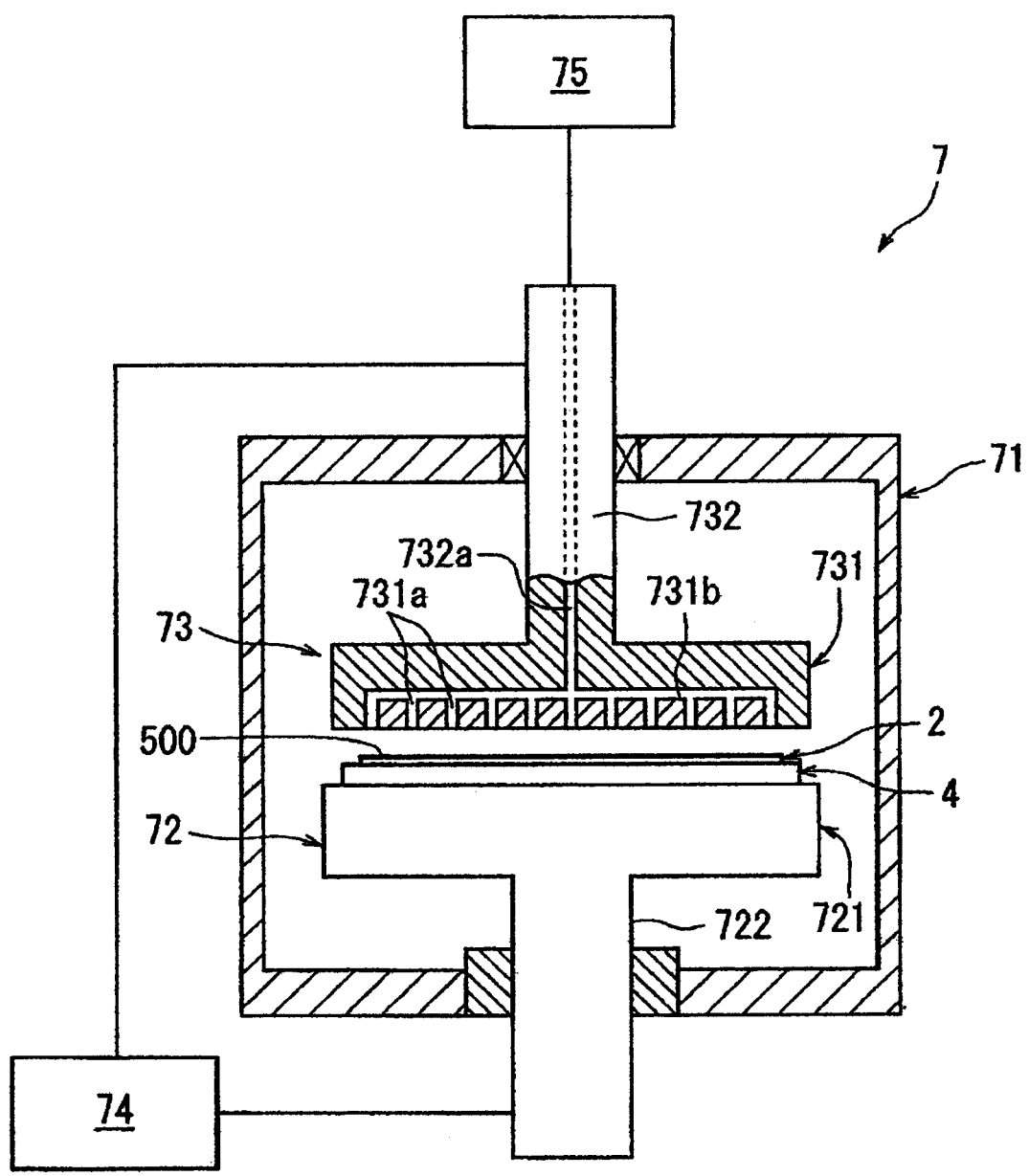
FIG. 6 is a sectional view of a plasma etching apparatus for performing an etching step.

After performing the masking step mentioned above, an etching step is performed in such a manner that the semiconductor wafer 2 is plasma-etched by using the cured resin films 500 as masks to thereby divide the semiconductor wafer 2 into the individual devices 22 along the division lines 21. This etching step is performed by using a plasma etching apparatus 7 shown in FIG. 6. As shown in FIG. 6, the plasma etching apparatus 7 includes a housing 71, a lower electrode 72 provided in the housing 71, and an upper electrode 73 provided in the housing 71 so as to be vertically opposed to the lower electrode 72. The lower electrode 72 is composed of a disk-shaped workpiece holding portion 721 and a cylindrical supporting portion 722 projecting downward from the lower surface of the workpiece holding portion 721 at a central portion thereof. The supporting portion 722 of the lower electrode 72 is connected to RF voltage applying means 74.

The upper electrode 73 is composed of a disk-shaped gas discharging portion 731 and a cylindrical supporting portion 732 projecting upward from the upper surface of the gas discharging portion 731 at a central portion thereof. The supporting portion 732 of the upper electrode 73 is connected to the RF voltage applying means 74. The gas discharging portion 731 of the upper electrode 73 is opposed to the workpiece holding portion 721 of the lower electrode 72. The gas discharging portion 731 of the upper electrode 73 is formed with a plurality of discharge ports 731a opening downward. These plural discharge ports 731a are in communication with gas supplying means 75 through a communication line 731b formed in the gas discharging portion 731 and a communication line 732a formed in the supporting portion 732. The gas supplying means 75 functions to supply a plasma generating gas such as sulfur hexafluoride ($SF_6$).

The plasma etching apparatus 7 mentioned above is used to perform the etching step in the following manner. First, the holding table 4 holding the semiconductor wafer 2 processed by the masking step is placed on the workpiece holding portion 721 of the lower electrode 72. Accordingly, the holding table 4 holding the semiconductor wafer 2 is placed on the workpiece holding portion 721 in the condition where the cured resin films 500 formed on the front side 2a of the semiconductor wafer 2 are oriented upward.

Figure 7:
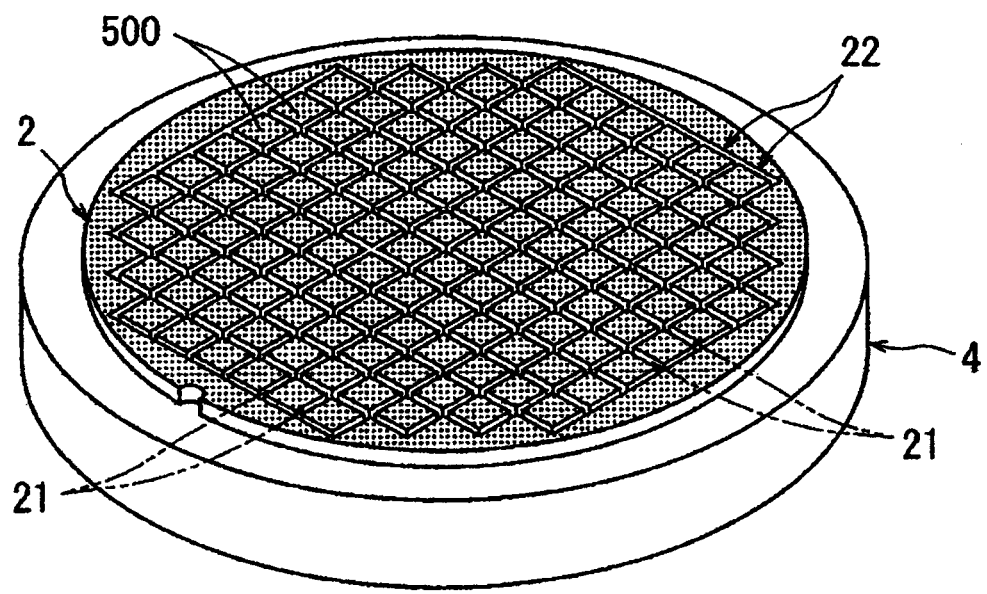
FIG. 7 is a perspective view of the semiconductor wafer processed by the etching step.

Thereafter, the gas supplying means 75 is operated to supply the plasma generating gas to the upper electrode 73. The plasma generating gas supplied from the gas supplying means 75 is fed through the communication line 732a formed in the supporting portion 732 and the communication line 731b formed in the gas discharging portion 731 to the plural discharge ports 731a. The plasma generating gas thus fed to the plural discharge ports 731a is discharged from the discharge ports 731a toward the front side 2a (upper surface) of the semiconductor wafer 2 held through the holding table 4 on the workpiece holding portion 721 of the lower electrode 72. In the condition where the plasma generating gas is supplied as mentioned above, the RF voltage applying means 74 is operated to apply an RF voltage between the lower electrode 72 and the upper electrode 73. As a result, a plasma is generated from the plasma generating gas in the space between the lower electrode 72 and the upper electrode 73, and a resultant active substance in the plasma state acts on the front side 2a (upper surface) of the semiconductor wafer 2. Accordingly, the semiconductor wafer 2 is etched along the division lines 21 as the etching regions other than the regions masked by the cured resin films 500 as shown in FIG. 7. Thus, the semiconductor wafer 2 is divided along the division lines 21 to obtain the individual devices 22.

As described above, the wafer processing method according to the present invention includes the frame preparing step of preparing the frame 3 having the plural crossing partitions 31 corresponding to the division lines 21 formed on the semiconductor wafer 2, the resin covering step of spreading the liquid resin 50 on the front side 2a or back side 2b of the semiconductor wafer (the front side 2a in this preferred embodiment) and positioning the partitions 31 of the frame 3 in alignment with the division lines 21 of the semiconductor wafer 2, thereby covering with the liquid resin 50 the regions on the front side 2a or back side 2b of the semiconductor wafer 2 (the front side 2a in this preferred embodiment) other than the regions corresponding to the division lines 21, the masking step of curing the liquid resin 50 supplied to the front side 2a or back side 2b of the semiconductor wafer 2 (the front side 2a in this preferred embodiment) and next removing the frame 3, thereby masking the regions other than the regions corresponding to the division lines 21, and the etching step of plasma-etching the semiconductor wafer 2 processed by the masking step to thereby divide the semiconductor wafer 2 into the individual devices 22 along the division lines 21. Accordingly, no exposure apparatus and no developing apparatus are required to thereby suppress an equipment cost.

Furthermore, the partitions 31 of the frame 3 to be prepared in the frame preparing step are treated with a release agent such as a coating of fluororesin. Accordingly, in removing the frame 3 from the semiconductor wafer 2 in the masking step, there is no possibility that the cured resin films 500 may stick to the partitions 31 of the frame 3, so that it is possible to prevent the generation of burrs due to sticking of the cured resin films 500 to the partitions 31.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A wafer processing method for dividing a wafer into individual devices along a plurality of crossing division lines formed on a front side of the wafer, the individual devices being respectively formed in a plurality of separate regions defined by the division lines, the wafer processing method comprising:

a frame preparing step of preparing a frame having a plurality of crossing partitions corresponding to the division lines of the wafer;

a resin covering step of spreading a liquid resin on the front side or back side of the wafer and positioning the partitions of the frame in alignment with the division lines of the wafer, thereby covering with the liquid resin the regions on the front side or back side of the wafer other than the regions corresponding to the division lines;

a masking step of curing the liquid resin supplied to the front side or back side of the wafer and next removing the frame, thereby masking the regions other than the regions corresponding to the division lines; and an etching step of plasma-etching the wafer processed by the masking step to thereby divide the wafer into the individual devices along the division lines;

the frame to be prepared in the frame preparing step being treated with a release agent for preventing that the liquid resin cured in the masking step may stick to the frame.

* * * * *